United States Patent
Chang et al.

(10) Patent No.: US 7,575,941 B2
(45) Date of Patent: Aug. 18, 2009

(54) METHOD OF MANUFACTURING PHOTODIODE

(75) Inventors: Ko-Hsing Chang, Hsinchu (TW); Su-Yuan Chang, Hsinchu Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 254 days.

(21) Appl. No.: 10/710,732

(22) Filed: Jul. 30, 2004

(65) Prior Publication Data

US 2005/0227402 A1    Oct. 13, 2005

(30) Foreign Application Priority Data

Apr. 8, 2004 (TW) .............................. 93109688 A (51) Int. Cl.
H01L 21/00 (2006.01)
H01L 29/74 (2006.01)

(52) U.S. Cl. ................. 438/21; 257/233; 257/E31.058; 257/E31.115; 257/E25.032

(58) Field of Classification Search ................ 438/439, 438/433, 305, 230, 48, 21, 485, 558; 257/519, 257/506, 410, 202, 466, 114, 436, 291, 233, 257/292, E31.058, E31.115, E25.032
See application file for complete search history.

(56) References Cited

U.S. PATENT DOCUMENTS

| | | | |
|---|---|---|---|
| 4,866,500 A * | 9/1989 | Nishizawa et al. | 257/114 |
| 5,180,690 A * | 1/1993 | Czubatyj et al. | 438/485 |
| 6,228,750 B1 * | 5/2001 | Shibib | 438/558 |
| 6,566,722 B1 | 5/2003 | Lin et al. | 257/427 |
| 6,569,700 B2 * | 5/2003 | Yang | 438/48 |
| 6,611,037 B1 * | 8/2003 | Rhodes | 257/466 |
| 6,639,261 B2 * | 10/2003 | Rhodes | 257/291 |
| 6,856,001 B2 * | 2/2005 | Rhodes | 257/519 |
| 6,969,899 B2 * | 11/2005 | Yaung et al. | 257/436 |

* cited by examiner

Primary Examiner—Davienne Monbleau
Assistant Examiner—Monica D Harrison
(74) Attorney, Agent, or Firm—Jianq Chyun IP Office (57) ABSTRACT

A method of manufacturing of a photodiode is provided. The photodiode is formed on a substrate of a first conductive type. First, an isolation structure is formed in the substrate to define a photosensitive area in the substrate. Thereafter, trenches are formed in the substrate. Next, a doped layer of a second conductive type is formed on the substrate. The doped layer covers at least the inner wall of the trenches and a top portion of the substrate. The method of fabricating the photodiode can reduce overall processing time and cost and improve production efficiency.

8 Claims, 11 Drawing Sheets

METHOD OF MANUFACTURING PHOTODIODE

CROSS REFERENCE TO RELATED APPLICATIONS

This application claims the priority benefit of Taiwan application serial no. 93109688, filed Apr. 8, 2004.

BACKGROUND OF INVENTION

1. Field of the Invention

The present invention relates to a method of manufacturing a photodiode. More particularly, the present invention relates to a method of manufacturing a photodiode that utilizes a chemical vapor deposition process instead of an ion implantation process to form the depletion region of a P-N junction.

2. Description of Related Art

Due to the rapid progress in the electronic industry, manufacturing techniques from different areas such as data transmission, consumer recreation and mobile communication are often integrated together to provide a multi-media function. In particular, multi-media imaging techniques are now mostly mature and have a wide range of applications. As the need for processing images continues to increase, photosensitive chips are once again in great demand in the market. The two most common types of photosensitive chips in the current market include the charge-coupled device (CCD) and the complementary metal-oxide-semiconductor (CMOS) image sensor.

Although most CCD image sensor has a higher immunity against noise interference and a better image quality, it has a lower response speed to external change and incapable of integrating with other system support chip. On the other hand, the CMOS image sensor is formed by using a CMOS fabrication technique. Hence, the CMOS image sensor not only requires less power to operate than a CCD chip, but can also integrate with other MOS devices. Furthermore, as CMOS fabrication technique matures, production cost is also lowered. Nowadays, CMOS image sensors have found a range of applications inside various cost sensitive communication and consumer electronic products.

A typical CMOS image sensor mainly includes a photodiode and a metal-oxide-semiconductor (MOS) transistor. The photodiode has a P-N junction with a depletion region that is sensitive to illumination such that a current passing the photodiode can be used as a signal indicating the intensity of illumination as well as the background noise when the photodiode is in total darkness. Through the signal/noise ratio of the current, the variation of external light intensity can be gauged.

Figure 1:
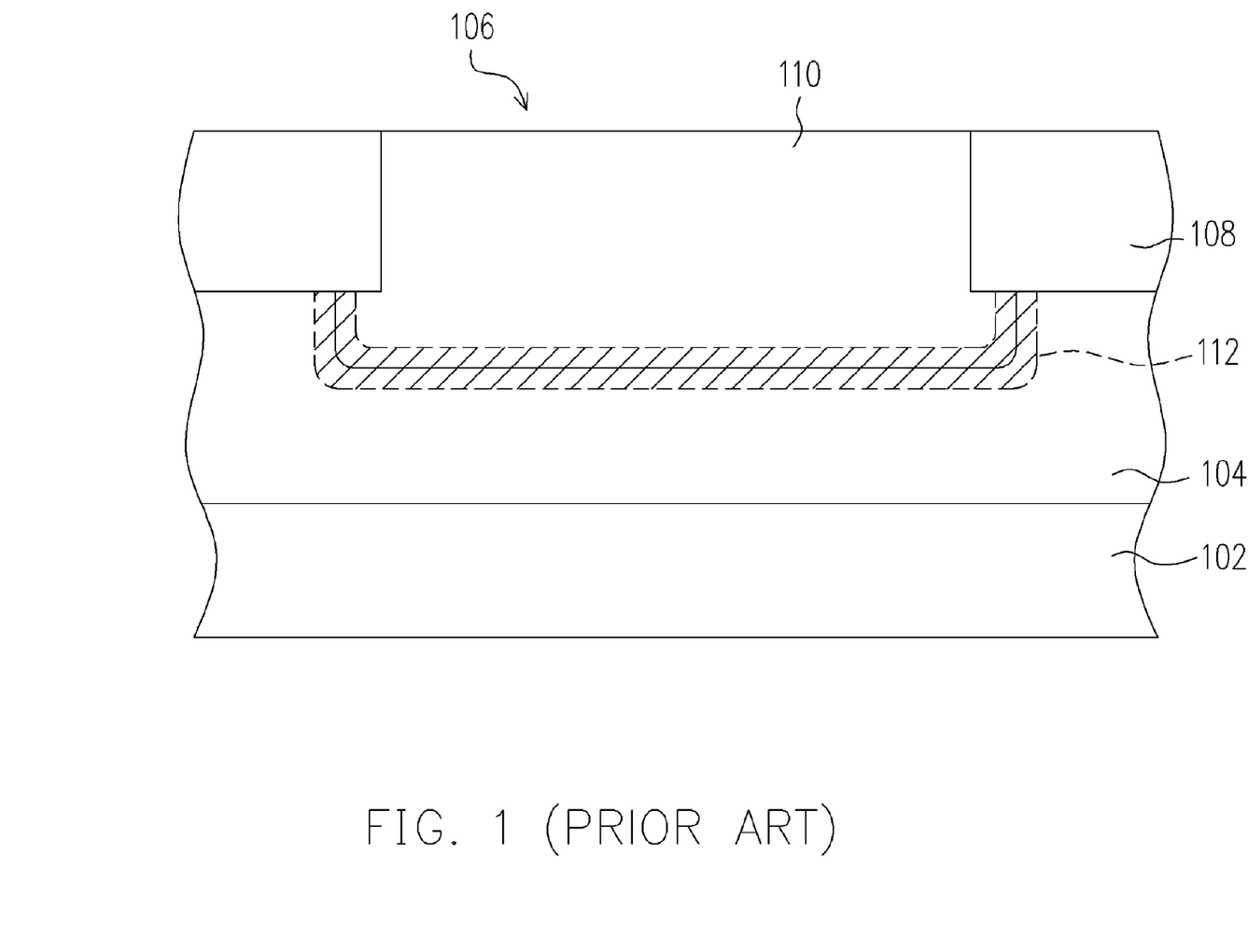
FIG. 1 is a schematic cross-sectional view of a portion of a conventional photodiode.

FIG. 1 is a schematic cross-sectional view of a portion of a conventional photodiode. As shown in FIG. 1, the photodiode has a silicon substrate 102 having a P-well 104 and a photosensitive area 106 thereon. The photosensitive area 106 is surrounded by a shallow trench isolation (STI) structure 108. Furthermore, an N-doped region 110 is formed above the P-well 104 within the photosensitive area 106 by performing an ion implantation process. Because the P-N junction at the interface between the P-well 104 and the N-doped region 110 produces a depletion region 112, the depletion region 112 can be used as a sensing region for detecting the intensity of external light. However, the aforementioned photodiode 100 has a narrow depletion region 112 and the depletion region 112 is located at a definite depth below the surface so that the signal/noise ratio is rather low. Ultimately, photodiode is unsuitable for sensing light at a shorter wavelength.

Figure 2:
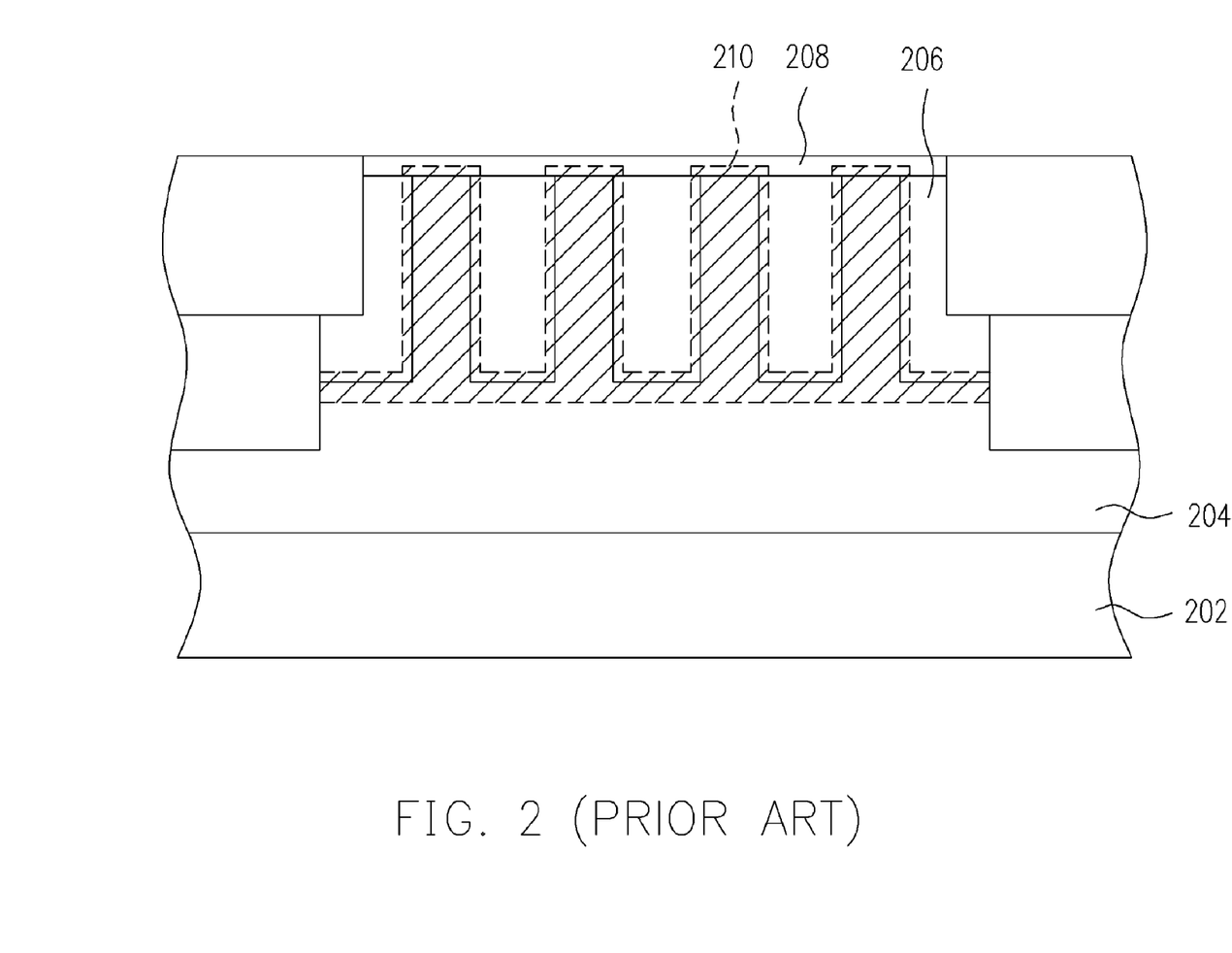
FIG. 2 is a schematic cross-sectional of a portion of another conventional photodiode.

FIG. 2 is a schematic cross-sectional of a portion of another conventional photodiode as disclosed in U.S. Pat. No. 6,566,722. As shown in FIG. 2, a P-type substrate 202 is provided and then a P-type epitaxial silicon layer 204 is formed over the substrate 202. Thereafter, a photolithographic and an ion implantation process are carried out in sequence to form a plurality of first N-doped regions 206 on the P-type epitaxial silicon layer 204. Finally, another photolithographic and ion implantation process are carried out in sequence to form a second N-doped region 208 over the P-type epitaxial silicon layer 204 and the first N-doped regions 206. After performing the aforementioned steps, a plurality of trench-shaped first N-doped regions 206 is formed in the P-type epitaxial silicon layer 204 so that the contact area between the first N-doped regions 206 and the P-type epitaxial silicon layer 204 is increased. With an increase in the area of the depletion region 210, the photodiode can have higher signal sensitivity. In addition, through the second N-doped region 208 on the P-type epitaxial silicon layer 204, sensitivity of the photodiode with respect to light of a shorter wavelength is enhanced. However, an ion implantation process is still deployed in the fabrication of the photodiode so that the density of dopants within the depletion region 210 may fluctuate and affect the sensing accuracy.

Figure 3:
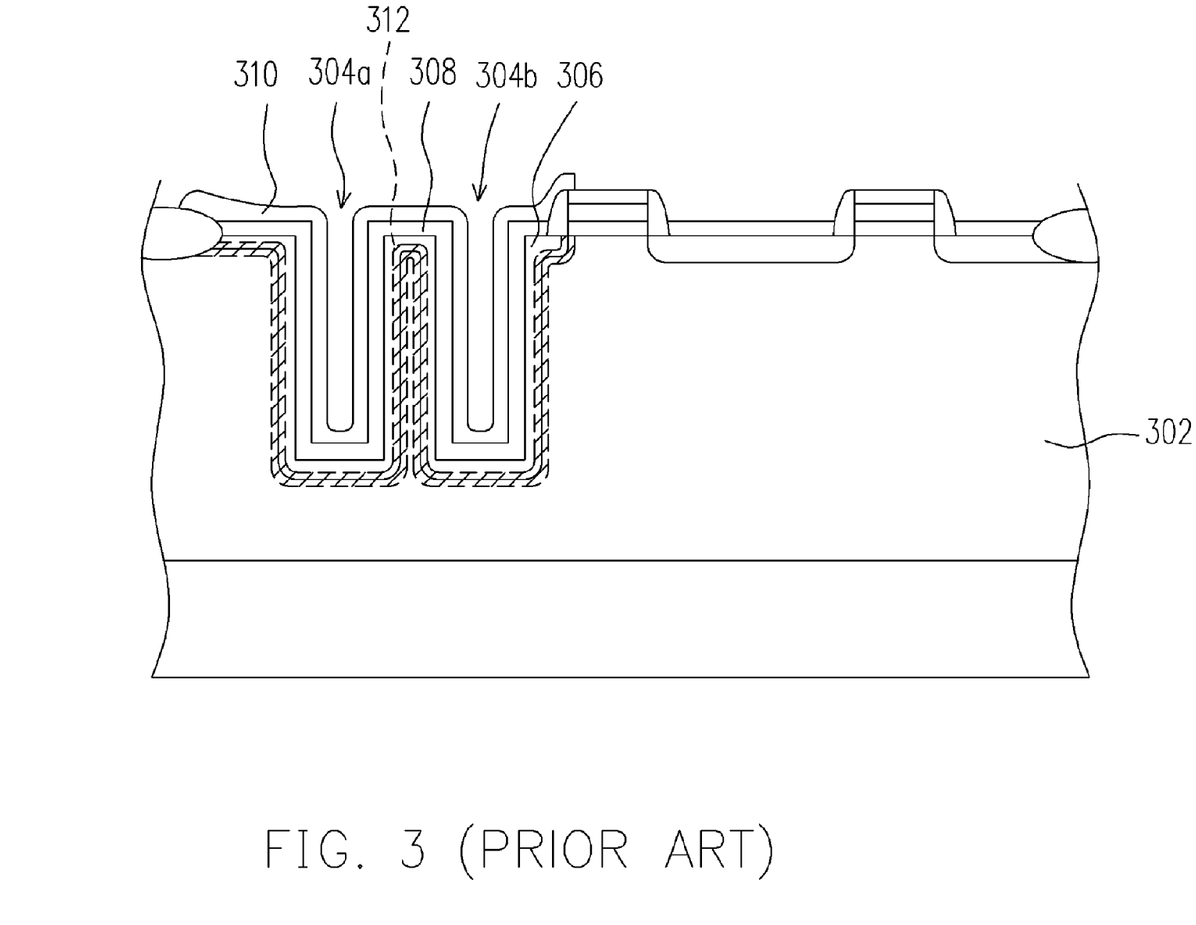
FIG. 3 is a schematic cross-sectional of a portion of yet another conventional photodiode.

FIG. 3 is a schematic cross-sectional of a portion of another conventional photodiode as disclosed in U.S. Pat. No. 6,611,037. As shown in FIG. 3, a P-type substrate 302 is provided and then trenches 304a and 304b are formed in the substrate 302. Thereafter, an ion implantation process is carried out to form an N-doped region 306 in the interior sidewalls of the trenches 304a and 304b as well as the P-type substrate 302 between the trenches 304a and 304b. Next, an isolation layer 308 and a conductive layer 310 are sequentially formed over the N-doped region 306. The interface between the N-doped region 306 and the P-type substrate 302 produces a P-N junction having a trench-like depletion region 312 capable of increasing overall sensitivity of the photodiode. However, due to the shape of the trench, a multiple ion implantation operations with the ion beam in each operation set to a different angle must be carried out to form a uniform N-doped region 306. Ultimately, both the processing time and the production cost of the photodiode are increased.

SUMMARY OF INVENTION

Accordingly, the present invention is directed to a method of fabricating a photodiode capable of simplifying the fabrication steps and reducing production cost.

According to an embodiment of the present invention, first, a well of a first conductive type and an isolation structure are formed in the substrate to define a photosensitive area. Thereafter, a plurality of trenches is formed in the substrate within the photosensitive area. A doped layer of a second conductive type is formed over the substrate such that the doped layer covers the interior wall of the trenches and the surface of the substrate within the photosensitive area.

According to an embodiment of the present invention, an annealing process is also carried out after forming the doped layer of the second conductive type over the substrate. Through the annealing process, the dopants within the doped layer are activated and are migrated into the substrate to produce a junction between the first conductive type and the second conductive type within the substrate. If the first conductive type is a P-doped material, then the second conductive type is an N-doped material. On the other hand, if the first conductive type is an N-doped material, then the second conductive type is a P-doped material.

According to an embodiment of the present invention, after forming the trenches but before forming the doped layer of the second conductive type, further includes forming a buffer layer over the substrate. The buffer layer covers the interior sidewalls of the trenches and the surface of the substrate within the photosensitive area. After forming the doped layer, an annealing operation can be carried out. Through the annealing operation, dopants within doped layer of the second conductive type are driven into the substrate so that the junction between the first conductive type and the second conductive type material is located in the substrate. Alternatively, through the annealing operation, the dopants within the doped layer of the second conductive type are driven into the buffer layer so that the junction between the first conductive type and the second conductive type material is located in the buffer layer.

Accordingly, the photodiode of the present invention is fabricated by forming a plurality of trenches in a substrate of the first conductive type and then performing a chemical vapor deposition process to form a doped layer over the sidewalls of the trench and a portion of the substrate. Because the substrate and the doped layer belongs to different conductive types, a junction having a surrounding depletion region capable of sensing incident light intensity is formed. Since the present invention is able to produce a depletion region with a larger area inside the photodiode, the photodiode can have higher sensitivity to the illumination level. In addition, the doped layer is formed in a chemical vapor deposition process instead of a conventional multi-stage ion implantation. Therefore, the method of the present invention is capable of producing a more uniform doped layer and reducing overall processing time. In other words, overall production efficiency is increased while the production cost is reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 4:
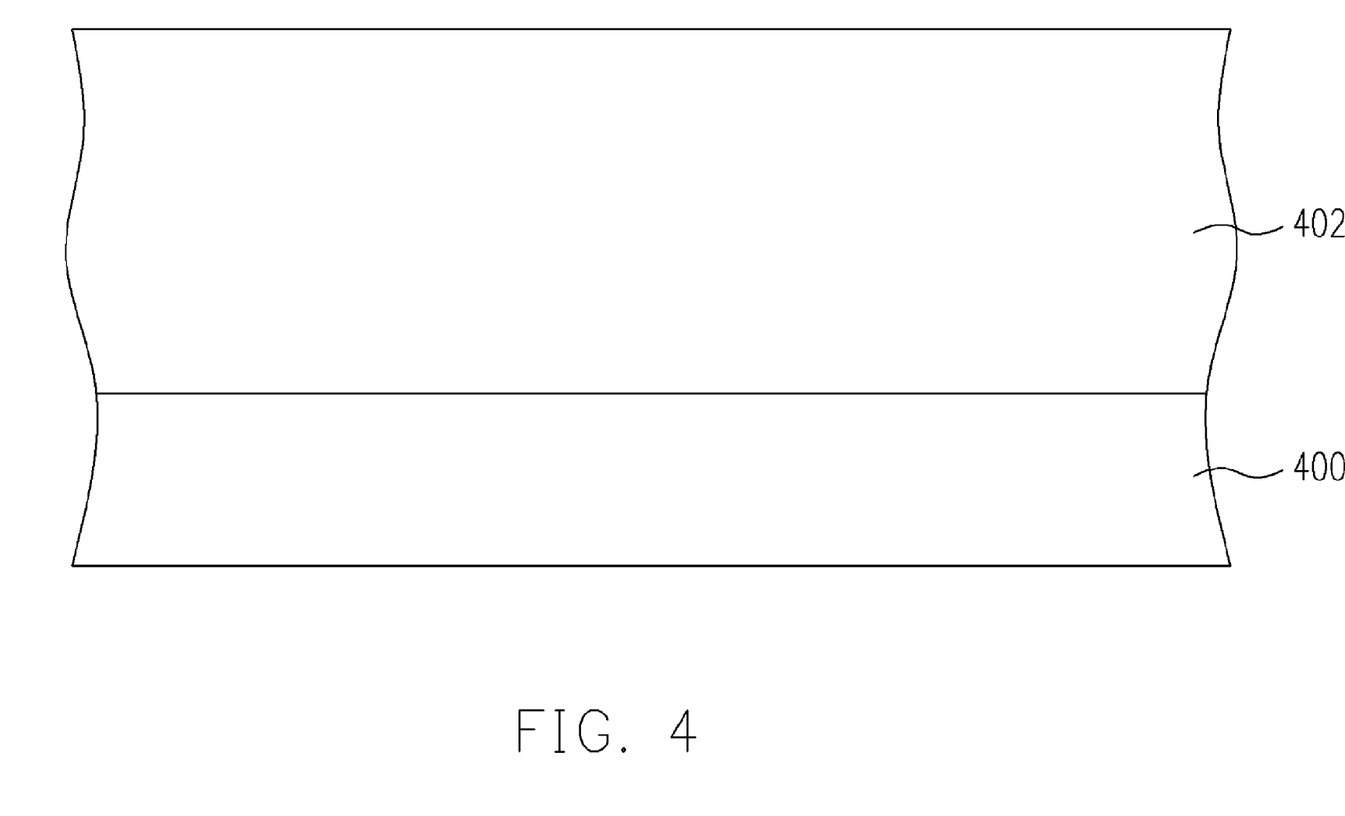
FIGS. 4 through 9 are schematic cross-sectional views showing the steps of fabricating a photodiode according to the present invention.

FIGS. 4 through 9 are schematic cross-sectional views showing the steps of fabricating a photodiode according to the present invention. First, as shown in FIG. 4, a substrate 400 is provided. The substrate 400 can be a P-type or an N-type silicon substrate, for example. Thereafter, a well region 402 of a first conductive type is formed in the substrate 400. The well region 402 is formed, for example, by forming a mask layer (not shown) over the substrate 400 to define a region (not shown) of the substrate 400 designated for forming the well region 402 and then performing an ion implantation process to form the well region 402 in the substrate 400. P-type dopants or N-type dopants can be used in the implantation to produce a P-type well or an N-type well 402.

Figure 5:
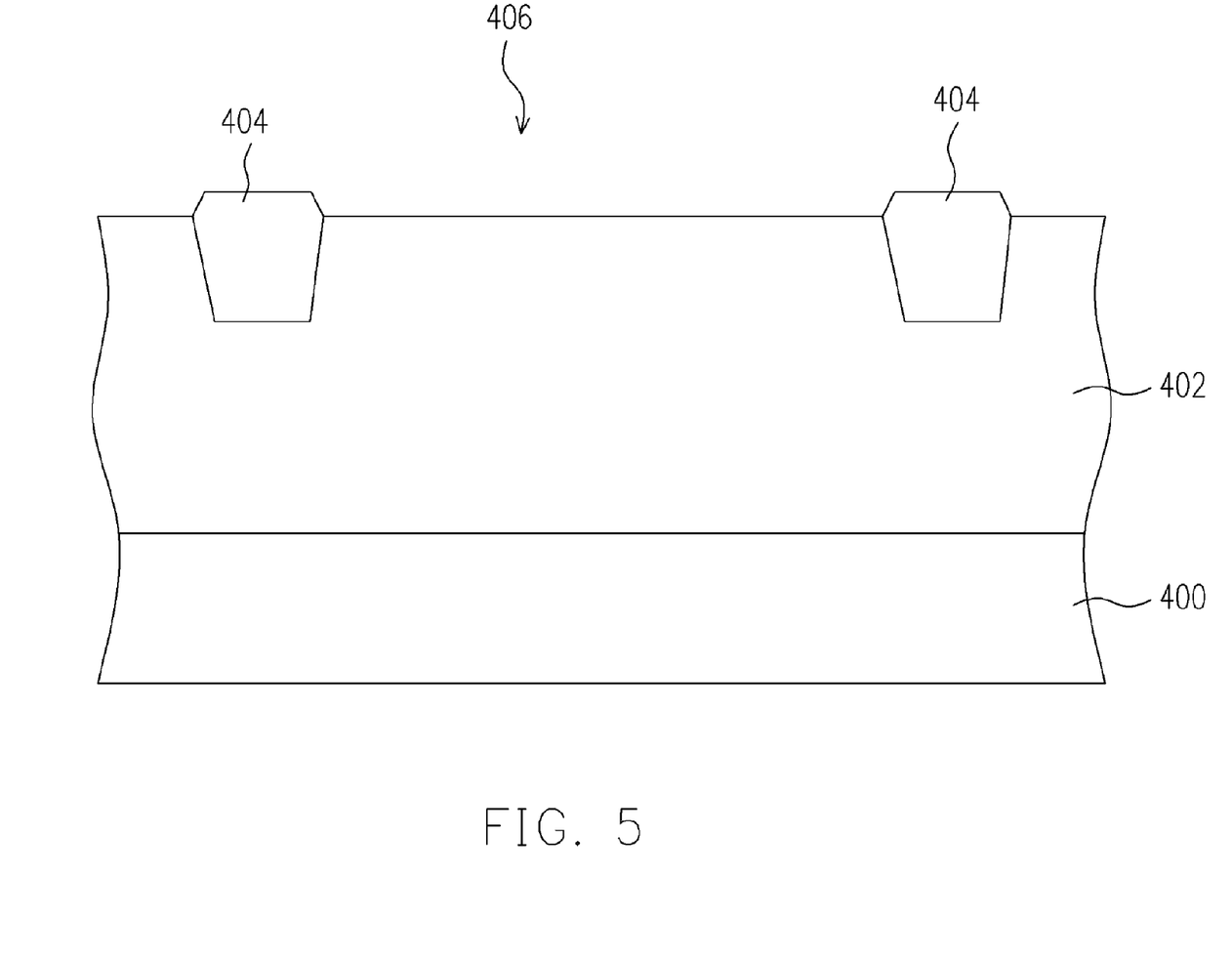

As shown in FIG. 5, an isolation structure 404 is formed in the well region 402 of the substrate 400 to define a photosensitive area 406. The isolation structure 404 can be a shallow trench isolation (STI) structure or a field oxide layer formed in a local oxidation of silicon (LOCOS) process, for example. The isolation structure 404 mainly serves as a barrier preventing any portion of an induced current from diffusing into neighboring sensing devices or electronic devices to cause mutual interference.

Figure 6:
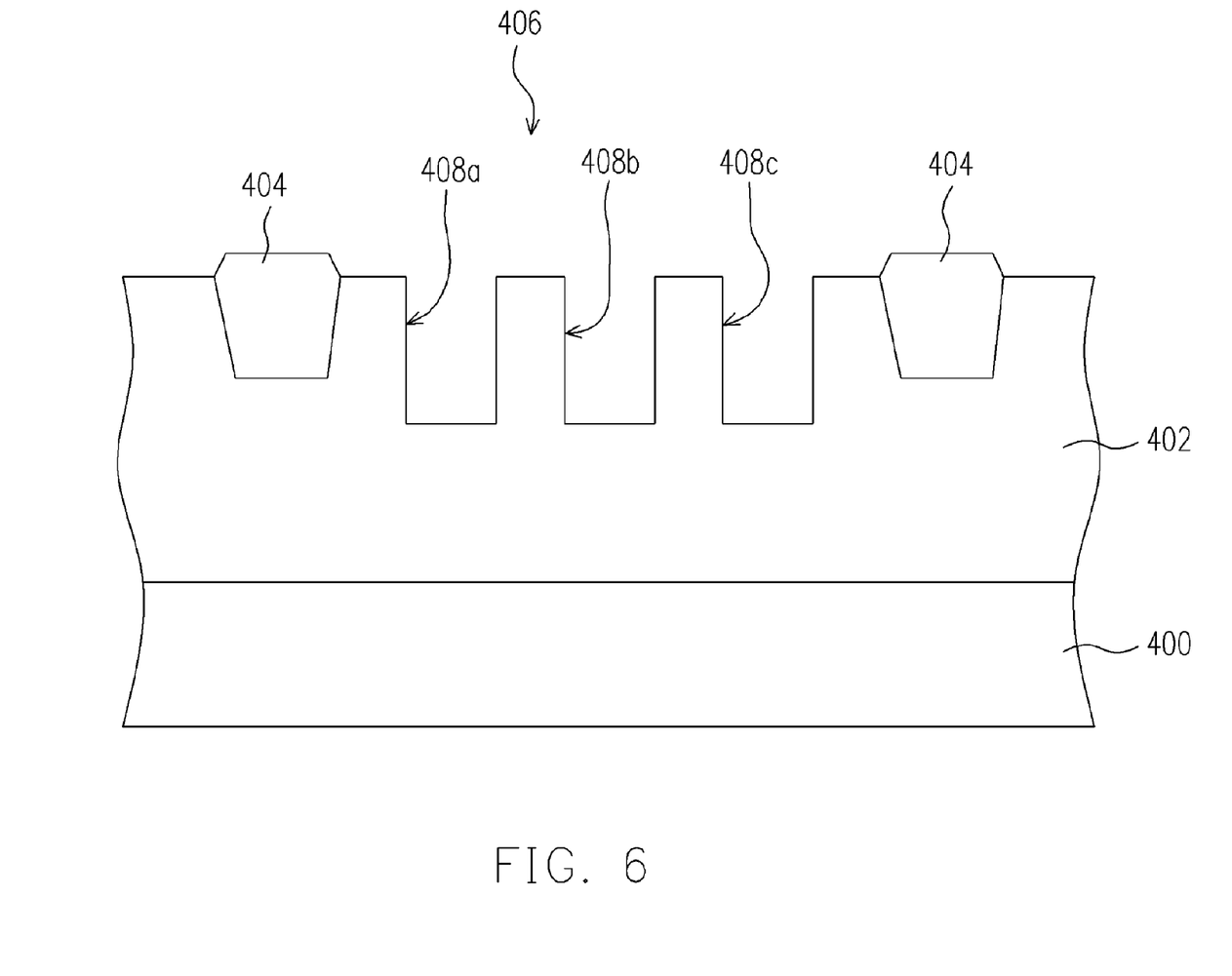

As shown in FIG. 6, a plurality of trenches such as 408a, 408b, and 408c are formed in the well region 402 of the substrate 400 within the photosensitive area 406. For example, a patterned mask layer (not shown) is formed over the well region 402 of the substrate 400 to define the locations of the trenches 408a, 408b and 408c. Thereafter, an anisotropic etching operation is carried out using the patterned mask layer as an etching mask to form the trenches 408a, 408b and 408c within the photosensitive area 406. Finally, the mask layer over the photosensitive area 406 is removed.

Figure 7:
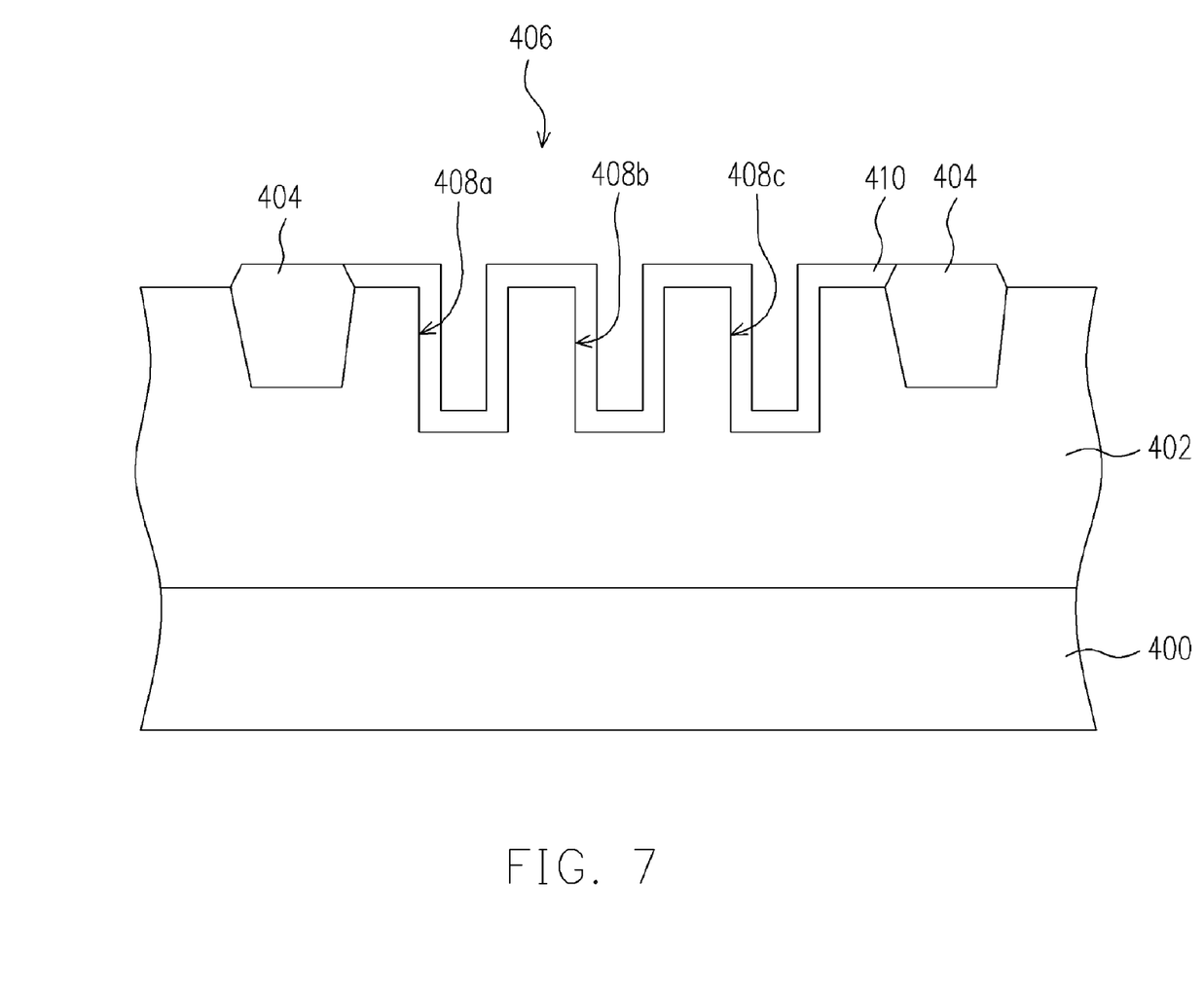

As shown in FIG. 7, a buffer layer 410 is formed over the photosensitive area 406 covering the interior sidewalls of the trenches 408a, 408b and 408c as well as the upper surface of the well region 402 of the substrate 400. The buffer layer 410 is formed by polysilicon or epitaxial silicon in a chemical vapor deposition process, for example. It should be noted that the buffer layer 410 is optional. In other words, this particular step of forming the buffer layer 410 can be skipped without any effect on the operation of the photodiode.

Figure 8:
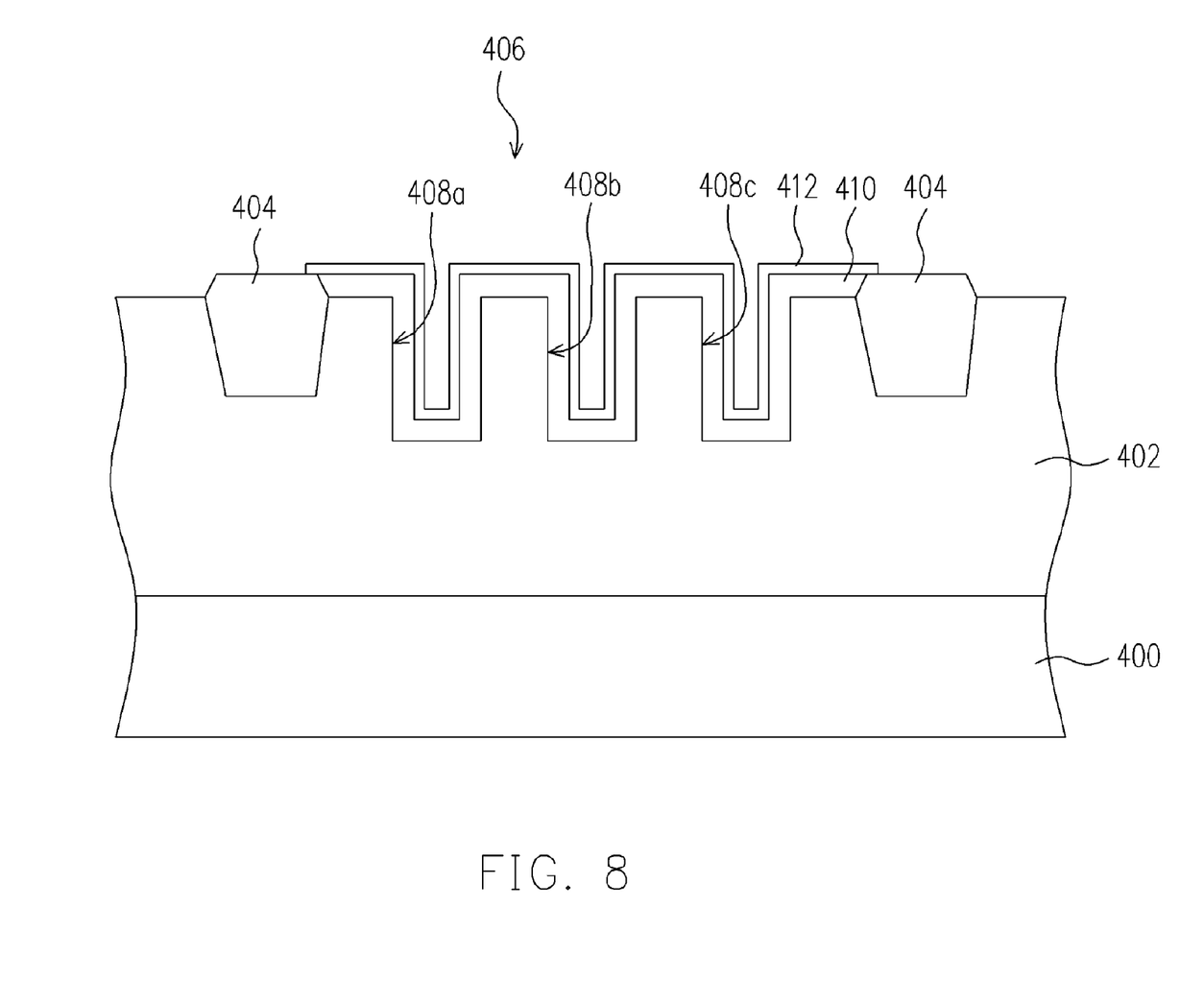

As shown in FIG. 8, a doped layer 412 of a second conductive type is formed over the buffer layer 410. The doped layer 412 is polysilicon or epitaxial silicon formed by using a chemical vapor deposition process. For example, the doped layer 412 can be a doped polysilicon or a doped epitaxial silicon layer formed by performing a chemical vapor deposition process with in-situ doping. It should be noted that the second conductive type is a conductive type material that differs from the first conductive type material within the well region 402. In other words, if the well region 402 is an N-type material, the doped layer 412 is a P-type material. Conversely, if the well region 402 is a P-type material, the doped layer 412 is an N-type material.

Figure 9:
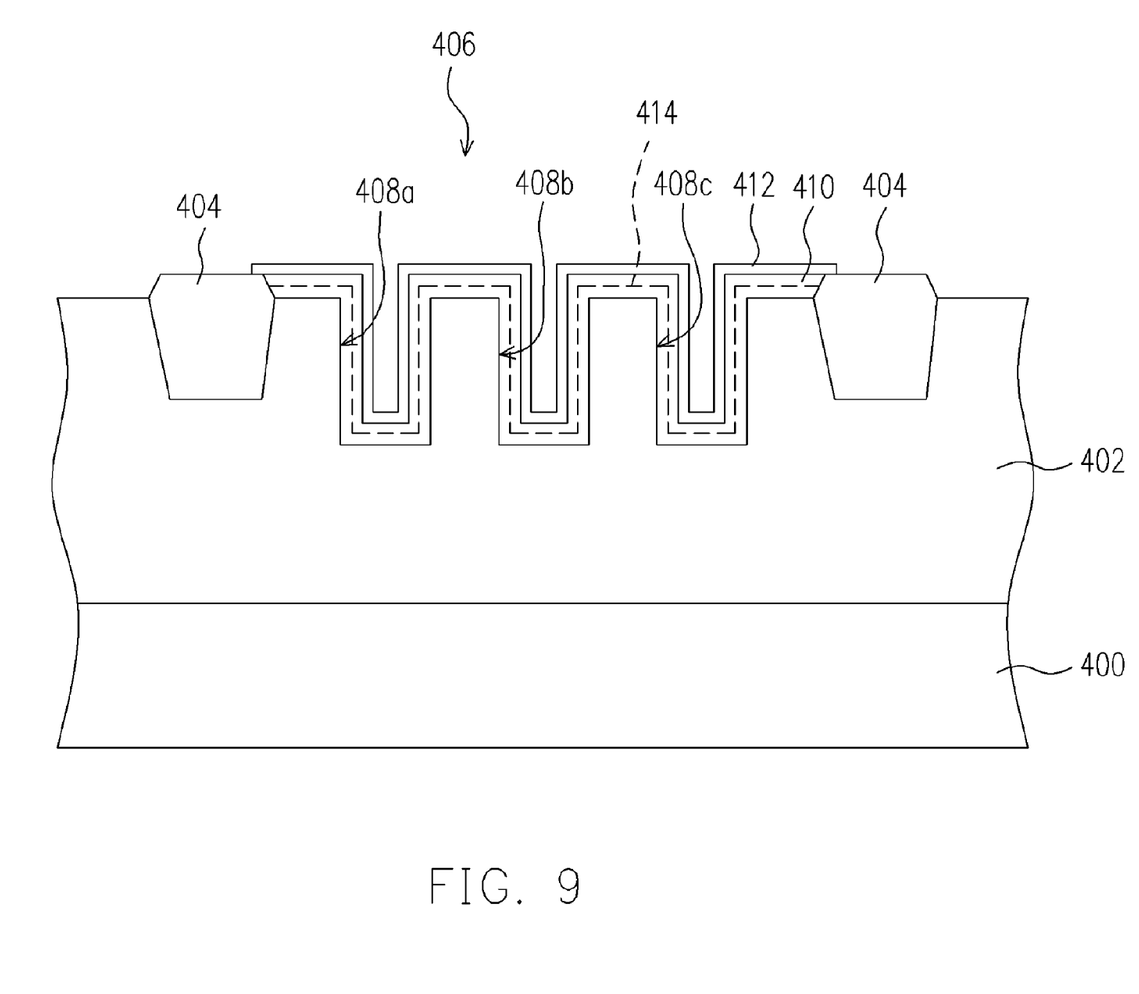

As shown in FIG. 9, an annealing operation is carried out. In this step, the presence or absence of the buffer layer will directly affect the outcome of the annealing operation. For example, if there is a buffer layer 410 between the well region 402 and the doped layer 412, the dopants within the doped layer 412 of the second conductive type will be driven into the buffer layer 410 after the annealing operation. Therefore, a junction 414 (a P-N junction) between the second conductive type and the first conductive type material is formed within the buffer layer 410 as shown in FIG. 9. Obviously, if the second type dopants within the doped layer 412 are driven past the buffer layer 410 into the well region 402, a P-N junction (not shown) is formed there instead. In addition, if the annealing operation is performed in the absence of the buffer layer 410, the dopants within the doped layer 412 will migrate across its boundary into the well region 402 to form a P-N junction there.

Figure 10:
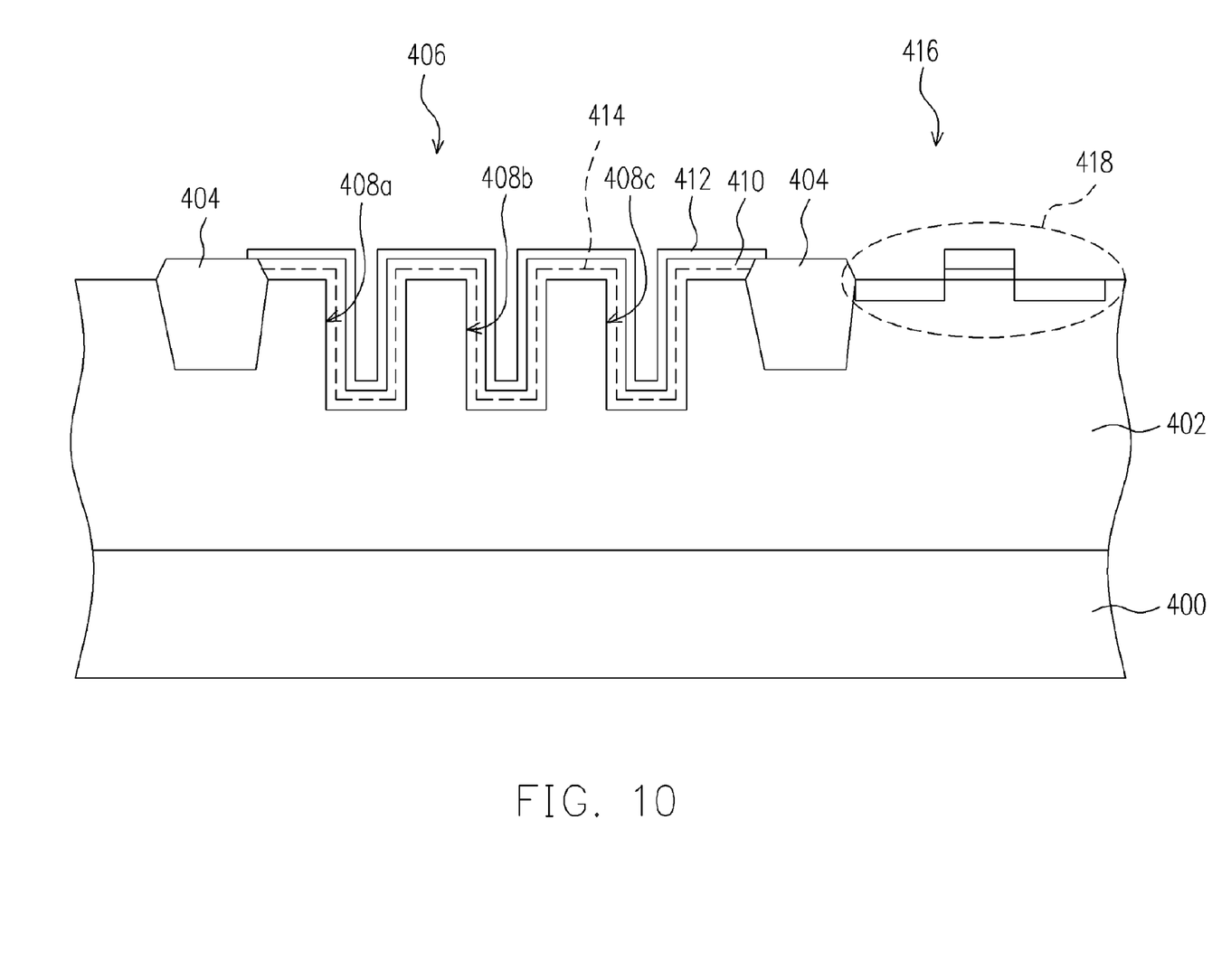
FIG. 10 is a schematic cross-sectional view of a portion of the photodiode fabricated according to the method of the present invention.

FIG. 10 is a schematic cross-sectional view of a portion of the photodiode fabricated according to the method of the present invention. Components in FIG. 10 identical to the ones in FIGS. 4 through 9 are labeled identically. As shown in FIG. 10, one major aspect of the present invention is the etching of the well region 402 of the substrate 400 to form the trenches 408a, 408b and 408c in the well region 402 of the substrate 400. Another aspect of the present invention is the performance of a chemical vapor deposition process to form the buffer layer 410 and the doped layer 412 on the inner walls of the trenches 408a, 408b and 408c as well as a portion of the upper surface of the well region 402 of the substrate 400. It should be noted that the buffer layer 410 and the annealing operation are optional and hence can be selectively applied. The buffer layer 410 mainly serves as a buffer between the doped layer 412 and the well region 402 in the substrate 400 so that the P-N junction 414 can be positioned within the buffer layer 410 instead of the well region 402. However, even in the absence of the buffer layer 410 so that the doped layer 412 contacts the well region 402 of the substrate 400 directly, a P-N junction having an adjacent depletion region is still produced to provide the photodiode with a means of detecting external illumination.

As shown in FIG. 10, a logic circuit area 416 is also formed over the substrate 400 outside the isolation structure 404 enclosed photosensitive area 406. Inside the logic circuit area 416, an electronic device such as a reset transistor 418 is disposed. The device within the logic circuit area 416 is formed before etching out the trenches 408a, 408b and 408c in the well region 402 of the substrate 400 or after all the aforementioned steps have been completed, for example. Since a conventional technique of forming the reset transistor 418 or related devices inside the logic circuit area 416 is deployed, detailed description is omitted.

Figure 11:
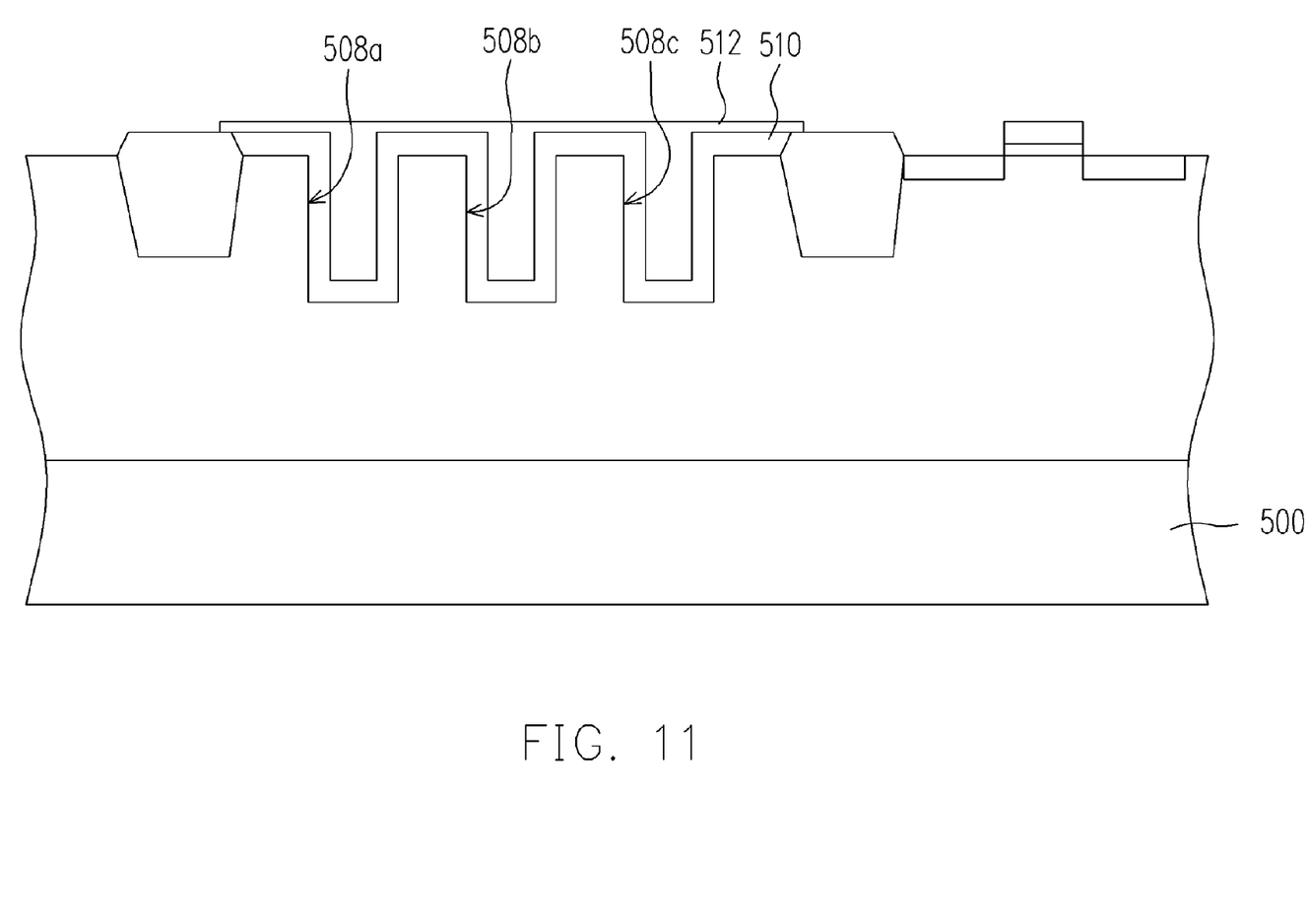
FIG. 11 is a schematic cross-sectional view of a portion of another photodiode fabricated according to the method of the present invention.

In FIG. 10, the doped layer 412 is a uniform thick layer over the buffer layer 410. However, the doped layer may completely fill all the trenches. FIG. 11 is a schematic cross-sectional view of a portion of another photodiode fabricated according to the method of the present invention. As shown in FIG. 11, the buffer layer 510 is a uniform layer covering all the interior walls of the trenches 508a, 508b and 508c as well as the surface of the well region 402 of the substrate 500 between the trenches 508a, 508b and 508c. The doped layer 512 covers the buffer layer 510 globally and completely fills the trenches 508a, 508b and 508c.

In summary, a plurality of trenches is formed in the substrate to increase the sensing area and hence the sensitivity of the photodiode in the present invention. Furthermore, a chemical vapor deposition process instead of ion implantation process is performed so that a more uniform doped layer is formed. Because the steps for forming the photodiode is also simplified, time for producing the photodiode is very much reduced. Consequently, overall production efficiency is increased while the production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a photodiode, comprising the steps of:
   providing a substrate;
   forming a well region of a first conductive type in the substrate;
   forming an isolation structure in the well region of the substrate to define a photosensitive area on the substrate;
   forming a plurality of trenches in the well region of substrate within the photosensitive area;
   forming a buffer layer of a semiconductor material over the well region of the substrate, wherein the buffer layer covers the interior walls of the trenches and the surface of the well region of the substrate within the photosensitive area;
   forming a doped layer of a second conductive type directly over the buffer layer; and
   performing an annealing operation to drive dopants within the doped layer into the buffer layer and form a junction of the second conductive type and the first conductive type within the buffer layer.

2. The method of claim 1, wherein the step of forming the doped layer comprises performing a chemical vapor deposition process.

3. The method of claim 1, wherein a material constituting the doped layer is selected from the group consisting of doped polysilicon and doped epitaxial silicon.

4. The method of claim 1, wherein the step of forming the buffer layer further comprises performing a chemical vapor deposition process.

5. The method of claim 1, wherein a material constituting the buffer layer is selected from the group consisting of polysilicon and epitaxial silicon.

6. The method of claim 1, wherein the first conductive type is P-type and the second conductive type is N-type.

7. The method of claim 1, wherein the first conductive type is N-type and the second conductive type is P-type.

8. The method of claim 1, wherein the doped layer completely fills the trenches.

* * * * *